United States Patent
Hikmet et al.

(10) Patent No.: US 11,739,884 B2
(45) Date of Patent: Aug. 29, 2023

(54) LED FILAMENTS WITH LIGHT-REFLECTIVE PARTICLES FOR PROVIDING SPARKLE

(71) Applicant: SIGNIFY HOLDING B.V., Eindhoven (NL)

(72) Inventors: Rifat Ata Mustafa Hikmet, Eindhoven (NL); Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 126 days.

(21) Appl. No.: 17/601,328

(22) PCT Filed: Apr. 7, 2020

(86) PCT No.: PCT/EP2020/059877
§ 371 (c)(1),
(2) Date: Oct. 4, 2021

(87) PCT Pub. No.: WO2020/208009
PCT Pub. Date: Oct. 15, 2020

(65) Prior Publication Data
US 2022/0186889 A1 Jun. 16, 2022

(30) Foreign Application Priority Data
Apr. 11, 2019 (EP) ..................... 19168573

(51) Int. Cl.
*F21K 9/232* (2016.01)
*H01L 25/075* (2006.01)
*H01L 33/50* (2010.01)
*H01L 33/52* (2010.01)
*H01L 33/60* (2010.01)

(52) U.S. Cl.
CPC ........... *F21K 9/232* (2016.08); *H01L 25/0753* (2013.01); *H01L 33/50* (2013.01); *H01L 33/52* (2013.01); *H01L 33/60* (2013.01)

(58) Field of Classification Search
CPC ..... F21K 9/232; H01L 25/0753; H01L 33/50; H01L 33/52; H01L 33/60; H01L 33/54; H01L 2933/0091
See application file for complete search history.

(56) References Cited

U.S. PATENT DOCUMENTS 7,220,025 B2   5/2007 Parker
10,359,152 B2 * 7/2019 Jiang ..................... F21K 9/232
(Continued)

FOREIGN PATENT DOCUMENTS

CN   201069064 Y   6/2008
CN   201589120 U   9/2010
(Continued)

*Primary Examiner* — Tracie Y Green

(57) ABSTRACT

The present disclosure relates to a light-emitting diode, LED, filament (110). According to an embodiment, the LED filament comprises an elongated substrate (111) and a plurality of light-emitting diodes, LEDs, (112) which are mechanically coupled to the substrate. According to an embodiment, the LED filament further comprises an at least in part light-transmissive encapsulation (114) which encapsulate the plurality of LEDs and at least partially encapsulates the substrate, and a plurality of at least partially light-reflective particles (115) which are arranged on an outer surface of the encapsulation.

12 Claims, 3 Drawing Sheets

(56) References Cited

U.S. PATENT DOCUMENTS

| | | |
|---|---|---|
| 2017/0227169 A1 | 8/2017 | Jiang et al. |
| 2018/0031185 A1* | 2/2018 | Pettmann ................ F21K 9/275 |
| 2018/0315899 A1 | 11/2018 | Li et al. |
| 2022/0341549 A1* | 10/2022 | Van Bommel ............ F21K 9/60 |

FOREIGN PATENT DOCUMENTS

| | | | | |
|---|---|---|---|---|
| CN | 201836802 U | | 5/2011 | |
| CN | 205244927 U | | 5/2016 | |
| CN | 206439675 U | | 8/2017 | |
| CN | 114423989 A | * | 4/2022 | ............ F21K 9/232 |
| KR | 20090017346 A | * | 2/2009 | |
| WO | 2017101783 A1 | | 6/2017 | |
| WO | 2017153252 A1 | | 9/2017 | |

* cited by examiner

LED FILAMENTS WITH LIGHT-REFLECTIVE PARTICLES FOR PROVIDING SPARKLE

CROSS-REFERENCE TO PRIOR APPLICATIONS

This application is the U.S. National Phase application under 35 U.S.C. § 371 of International Application No. PCT/EP2020/059877, filed on Apr. 7, 2020, which claims the benefit of European Patent Application No. 19168573.4, filed on Apr. 11, 2019. These applications are hereby incorporated by reference herein.

FIELD OF THE INVENTION

The present disclosure relates to light-emitting diode filaments for lighting devices.

BACKGROUND

Incandescent lamps are rapidly being replaced by light-emitting diode (LED) based lighting solutions. Compared to incandescent lamps, fluorescent lamps, gas discharge lamps etc., solid state based light sources may provide numerous advantages such as, e.g. longer operational life, reduced power consumption, higher efficacy, less heat generation, green environmental products (i.e. not including mercury). Solid state lighting devices such as LEDs are employed in a wide range of lighting applications including general lighting.

Solid state lighting devices have been developed as retrofit lamps to have the look of an incandescent bulb. However, there is always a need tin providing more decorative solid state lighting devices.

Further, the colour of the light provided by a LED lamp often varies as a function of the angle of emitted light. This colour-over-angle (COA) effect is sometimes significant and can lead to yellow rings at large angles in the far-field of a white LED. LED retrofit lamps also often provide a more directional light than their incandescent counterparts. As a result, the light from these lamps may cause sharper contrasts between lit and shadowy areas, and make objects seem flat.

In US 2017/227169 an LED light bulb is disclosed that includes a bulb shell, a bulb base, a stem, conductive supports, an LED filament, and a supporting arm.
the LED filament comprises a plurality of LED chips at least two conductive electrodes and a light conversion coating. The plurality of LED chips and the conductive electrodes are electrically connected therebetween. The light conversion coating coats on at least two sides of the LED chips and the conductive electrodes. The light conversion coating exposes a portion of two of the conductive electrodes. The light conversion coating comprises an adhesive, a plurality of inorganic oxide nanoparticles and a plurality of phosphors.

SUMMARY

It is therefore an object of the present disclosure to overcome some of the above mentioned drawbacks and to provide an improved LED filament.

This and other objectives are achieved by means of a LED filament as described in the independent claim. Other embodiments are defined by the dependent claims.

According to an aspect of the present disclosure, there is provided a LED filament. The LED filament comprises an elongated substrate, a plurality of light-emitting diodes (LEDs), an encapsulation and a plurality of at least partially light-reflective particles. The LEDs are mechanically coupled to the substrate, and the encapsulation encapsulates the LEDs and at least a part of the substrate. The at least partially light-reflective particles (e.g. glitters or flakes) are arranged on an outer surface of the encapsulation. An at least partially light-reflective particle may for example have high aspect ratio, it may in particular be a flat particle.

According to some embodiments, an at least partially light-reflective particle (or glitter flake) may comprise a first face and a second face. The first face may lie against the encapsulation, facing the substrate and the LEDs. The second face may be opposite to the first face, and may be directed away from the encapsulation. The second face may for example face the environment around the filament.

The encapsulation comprises a volume of a material which encapsulates the LEDs and at least a part of the substrate. The outer surface of the encapsulation is a surface of the encapsulation volume which faces the exterior of the encapsulation. In other words, it faces away from the encapsulation and the LEDs, and towards the surroundings of the encapsulation.

The at least partially light-reflective particles on the outer surface of the encapsulation may give the LED filament a sparkling appearance in the OFF-state (i.e. when the LEDs of the filament are not turned on) by reflecting environmental light (outside light, surrounding light, i.e. light from other sources) in various directions. This sparkling appearance may increase the decorative character of the LED filament.

Further, the at least partially light reflective particles on the encapsulation surface may redirect light emitted by the LEDs in the ON-state (i.e. when the LEDs of the filament are turned on) at other angles. This redirection may lead to a more omnidirectional spreading of the emitted light, which may in turn give the light a softer appearance, and lessen the sharp contrast often caused by conventional LED filaments.

A particle of the at least partially light-reflective particles may have at least one flat surface, and be characterised by a longest dimension length, L1, a shortest dimension length, L2, and a further dimension length, L3. The dimension lengths of the light-reflective particles may be related through specified aspect ratios. A first aspect ratio, AR1, is defined as the ratio between the longest dimension length and the shortest dimension length. Further, the at least partially light-reflective particles may be characterized by a second aspect ratio, AR2, defined as the ratio between the further dimension length and the shortest dimension length. The at least partially light-reflective particles may be characterized by a third aspect ratio, AR3, which is the ratio between the longest dimension length and the further dimension length.

In some embodiments, the at least partially light-reflective particles' dimension lengths and ratios may meet certain requirements to provide an improved sparkling appearance. As an example, the longest dimension length, L1, may be in the range 0.1-3 mm. Similarly, the further dimension length, L3, may also be in the range 0.1-3 mm. The shortest dimension length, L2, may be in the range 10-300 μm.

In some embodiments, the first aspect ratio, AR1, may be in the range 10-300. The second aspect ratio, AR2, may also be in the range 10-300. The third aspect ratio, AR3, may be in the range 0.3-3.

According to some embodiments, the LED filament may have a diameter, D. The longest dimension length, L1, may be defined in relation to the diameter. For example, the longest dimension length may be in the range 0.1D-D (i.e. 0.1D<L1<D).

According to some embodiments, the at least partially light-reflective particles may be rigid (for example unable to bend or be forced out of shape; not flexible), which further improves the reflectivity of the light-reflective particles, such that they act as micro mirrors.

According to some embodiments, the at least partially light-reflective particles may be randomly distributed or randomly oriented, or both. A random distribution and/or arrangement of the particles may further increase the glittering effect of the LED filament, in that the environmental light is reflected in a more random fashion. Random distribution and/or orientation of the at least partially light-reflective particles may also increase the omnidirectional spreading of the emitted light in the ON-state since the emitted light may be redirected more randomly.

Although the at least partially light-reflective particles are described to be randomly distributed and/or oriented, other embodiments are possible. To give an example, the at least partially light-reflective particles may be evenly spread out, or concentrated towards a certain area of the encapsulation surface.

The LED filament coverage, denoted C, represents the coverage of the at least partially light-reflective particles on the outer surface of the encapsulation. Certain sub-ranges of the LED filament coverage have proven to provide a more optimal sparkling appearance, while not blocking the light emitted by the LEDs.

According to some embodiments, the minimum LED filament coverage, denoted $C_{min}$, may be 3%.

According to some embodiments, the at least partially reflective particles may be opaque (non-transmissive). For these embodiments, the maximum LED filament coverage, $C_{max}$, may be 30% for an optimal sparkling appearance.

According to some other embodiments, the at least partially light-reflective particles may be transmissive, with a transmissivity denoted T. According to some embodiments, the transmissivity of these particles is less than 40%, i.e. T<40%. Transmissive particles may allow for some of the light emitted by the LEDs to pass through the particles, with the result that a larger coverage of the filament is possible. For these embodiments, the maximum LED filament coverage, $C_{max}$, may be dependent on the transmissivity of the particles. However, the coverage should never be less than $C_{min}$=5% The maximum coverage may thus be expressed as:

$$C_{max} = \max_{0 \leq T \leq 50}\left[5, \left(\frac{T}{50}\right) \cdot 100\right]$$

According to some embodiments, the at least in part light-transmissive encapsulation may comprise wavelength converting material. An encapsulation comprising wavelength converting material may extend the spectrum of light emitted by the LED filament. In most everyday lighting applications white light is the preferred choice. In a LED filament, the LEDs may be selected to emit blue light. Providing the encapsulation with wavelength converting material, e.g. different phosphors, some of the blue light may be absorbed by said wave-length converting material. Some absorbed blue light may undergo the Stokes shift and be emitted as longer wavelengths (e.g. other blues, reds and greens/yellows). The combination of different wavelengths may give the impression of white light. Through selection of LEDs and wavelength converting material, the colour and tone of the emitted light may be defined. The light emitted by the LED-filament (LED filament light) may for example be within 15 standard deviations of colour matching (SCDM) from the black body line (BBL). Further, the LED-filament light may further have a colour rendering index (CRI) of at least 70.

In the embodiments comprising wavelength converting material in the encapsulation, the at least partially light-reflective particles may have a positive impact on the colour-over-angle, COA, variation. At large angles the blue light may propagate longer through the encapsulation. Blue light passing through more wavelength converting material may lead to more blue light being absorbed, and thus more green and red light being emitted. Consequently, the outer regions of the illuminated area may get a more yellow hue. Light-reflective particles on an outer surface of the encapsulation may redirect light of different wavelengths in more and different directions, which may lessen the color-over-angle-variation.

According to some embodiments, a particle of the at least partially light-reflective particles may have a wavelength dependent reflection coefficient. In the OFF-state, light-reflective particles having a wavelength dependent reflection coefficient may provide coloured sparkling effects, which may further increase the decorativeness of a LED filament.

According to some embodiments, a particle of the at least partially light-reflective particles may comprise a multilayer reflector.

According to some embodiments, a particle of the at least partially light-reflective particles may comprise a dichroic mirror.

In some embodiments of the present disclosure, at least one LED filament, as described in relation to any of the previous embodiments, may be part of a lighting device. The lighting device may further comprise an at least in part light-transmissive envelope, which may at least partially envelope the at least one LED filament. The lighting-device may also comprise a base, on which the at least partially light-transmissive envelope may be mounted. The base may comprise an electrical connector connectable to a luminaire socket for electrically connecting the lighting device.

The base may for example be constructed so that the lighting device may act as a retrofit lamp. Further, the at least in part light-transmissive envelope may have a pear shape similar to that of a traditional incandescent bulb.

According to some embodiments, a lighting device comprising at least one LED filament, as described above, may be connected to a luminaire. The luminaire may comprise a socket, which is connectable to the electrical connector of a lighting device, and a lighting device connected to the socket.

It is noted that other embodiments using all possible combinations of features recited in the above described embodiments may be envisaged. Thus, the present disclosure also relates to all possible combinations of features mentioned herein. Any embodiment described herein may be combinable with other embodiments also described herein, and the present disclosure relates to all combinations of features.

BRIEF DESCRIPTION OF DRAWINGS

This and other aspects of the present invention will now be described in more detail, with reference to the appended drawings showing embodiment(s) of the invention. The figures should not be considered limiting the invention to the specific embodiment; instead they are used for explaining and understanding the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

Exemplifying embodiments will now be described more fully hereinafter with reference to the accompanying drawings, in which currently preferred embodiments are shown. The invention may, however, be embodied in many different forms and should not be construed as limited to the embodiments set forth herein; rather, these embodiments are provided for thoroughness and completeness, and to fully convey the scope of the invention to the skilled person.

Figure 1A:
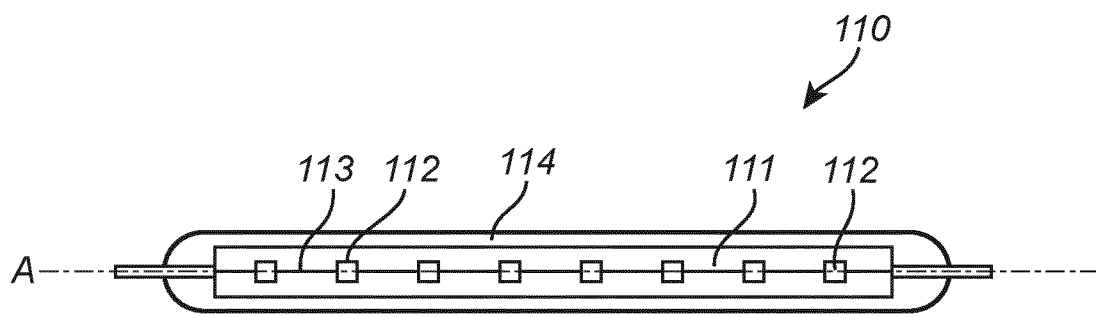
FIGS. 1a-b show schematic side views of a LED filament, in accordance with some embodiments.
Figure 1B:
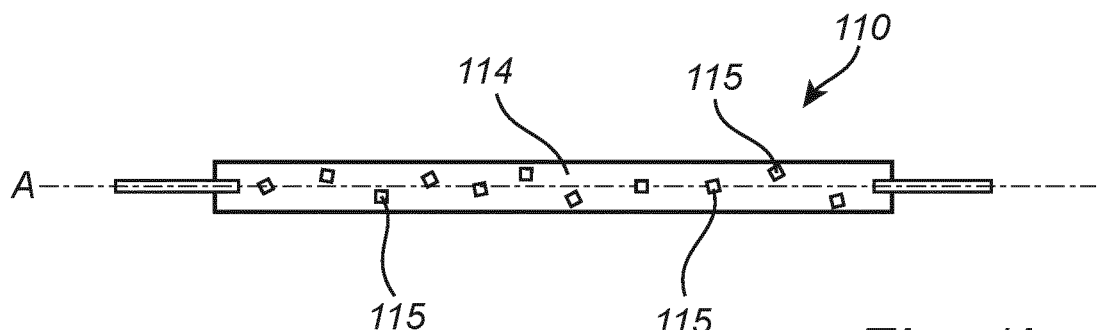

With reference to FIGS. 1a and 1b, a LED-filament in accordance with some embodiments will be described.

FIGS. 1a and 1b both show schematic side views of a LED filament, in accordance with some embodiments.

As illustrated in FIG. 1a, a LED-filament 110 according to the present embodiment comprises an elongated substrate 111 and a plurality of light-emitting diodes (LEDs) 112 and an at least in part light-transmissive encapsulation 114. It may also comprise wiring 113 for powering the LEDs. As shown in FIG. 1b, a LED-filament 110 may further comprise a plurality of at least partially light-reflective particles 115 arranged on an outer surface of the encapsulation 114.

The substrate 111 may be light-transmissive, such as translucent or transparent. The substrate 111 may for example be made of one of, or a combination of, glass, sapphire, quarts and ceramic material. A light-transmissive, translucent or transparent substrate may allow emitted light to escape the LED-filament at all angles.

The substrate 111 may be rigid. Alternatively, the substrate 111 may be flexible, which may enable aesthetic, non-rigid configurations.

The substrate may comprise an elongated body, extending along an elongation axis A. The elongation axis A may be at least in part straight, or substantially straight. However, it will be appreciated that the elongation axis of the substrate may be at least in part curved. For example, the substrate, and thus the LED-filament, may be shaped according to a coil. The substrate may be arranged such that it comprises one or more portions or segments wherein the elongation axis of the substrate is straight, or substantially straight, and one or more other portions or segments wherein the elongation axis of the substrate is curved.

The LEDs 112 are mechanically coupled to the substrate 111. In some embodiments, the LEDs 112 may be arranged only on a first surface of the substrate, the first surface being a major surface or a large surface in comparison to other surfaces of the substrate.

The LEDs may be arranged along the elongation axis A. The LEDs 112 are configured to emit light when operated or activated, i.e. in the ON-state. The LEDs 112 may further be configured to emit light having substantially the same spectral distribution. Alternatively, the LEDs 112 may be adapted to emit light having different spectral distributions. The plurality of LEDs 112 may be powered via a wiring 113. The wiring 113 may for example comprise an electrically conductive track.

The at least in part light-transmissive encapsulation 114 encapsulates the LEDs 112 and at least part of the substrate 111.

In some embodiments, the encapsulation 114 may encapsulate at least part of the first, major, surface of the substrate.

In some embodiments, the encapsulation 114 may encapsulate at least part of the first major surface of the substrate, and at least part of a second major surface of the substrate. The second major surface of the substrate may be opposite to the first major surface of the substrate.

In accordance with some embodiments, the encapsulation may fully encapsulate the first surface of the substrate.

In some embodiments, the encapsulation may fully encapsulate both the first and the second major surfaces of the substrate.

In some embodiments, the encapsulation may fully encapsulate all surfaces of the substrate (i.e. the entire substrate).

The encapsulation may comprise light-diffusing elements, for example scattering particles, to spread the light and avoid uneven lighting. Alternatively, the encapsulation 114 may comprise a scattering material.

Within the concept of the present invention, a LED filament is providing LED filament light and comprises a plurality of light emitting diodes (LEDs) arranged in a linear array. Preferably, the LED filament has a length L and a width W, wherein L>5W. The LED filament may be arranged in a straight configuration or in a non-straight configuration such as for example a curved configuration, a 2D/3D spiral or a helix. Preferably, the LEDs are arranged on an elongated carrier like for instance a substrate, that may be rigid (made from e.g. a polymer, glass, quartz, metal or sapphire) or flexible (e.g. made of a polymer or metal e.g. a film or foil).

In case the carrier comprises a first major surface and an opposite second major surface, the LEDs are arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major or second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods.

The LED filament may comprise multiple sub-filaments.

Figures 2A, 2B:
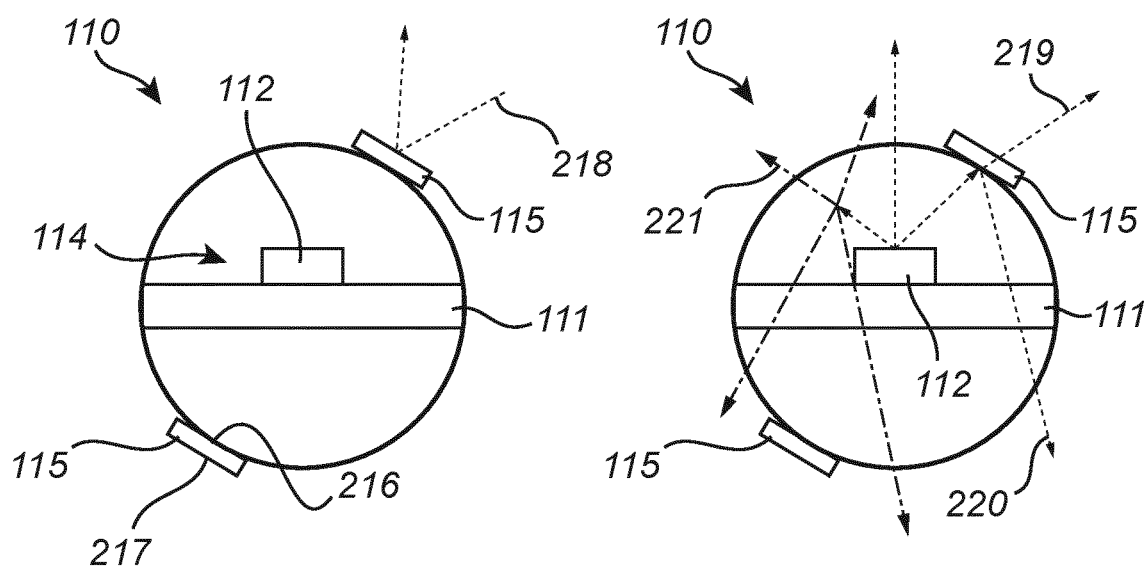
FIGS. 2a-b show schematic sectional views of a LED-filament in accordance with some embodiments. The figures illustrate a cross section of the LED-filament in a plane perpendicular to an elongation axis of the LED-filament

With reference to FIGS. 2a and 2b, embodiments of a LED-filament with a plurality of at least partially reflective particles 115 will be described.

FIGS. 2a and 2b both show schematic sectional views of a LED-filament in accordance with some embodiments. These figures illustrate a cross section of the LED-filament in a plane perpendicular to an elongation axis of the LED-filament, such as the elongation axis A mentioned in relation to FIGS. 1a and 1b.

As shown in FIG. 2a, a particle of the at least partially light-reflective particles 115 may comprise a first face 216 and a second face 217. The first face 216 may lie against the encapsulation 114, facing the encapsulation 114 and the substrate 111. The second face 217 may be opposite to the first face 216 and be directed away from the encapsulation 114.

The at least partially light-reflective particles 115 are arranged on the outside of the encapsulation 114, i.e. they are not embedded in the encapsulation. The particles 115 may be attached to the encapsulation using an adhesive. In some embodiments, the adhesive may form part of the encapsulation, e.g. the particles 115 may be attached using the encapsulation itself. In some embodiments, the particles 115 may be attached to the encapsulation 114 using a second encapsulation (not depicted) at least partially encapsulating the first encapsulation 114.

As an alternative, this may include that the particles 115 are partly impressed in the encapsulation 114, leaving the second face 217 free.

The reflectance of the at least partially light-reflective particles 115 may be at least 75%. Particularly, the reflectance of the particles 115 may be at least 80%. More particularly, the reflectance of the particles 115 may be at least 85%.

The at least partially light-reflective particles may for example have high aspect ratios, they may in particular comprise flat particles.

The at least partially light-reflective particles 115 on the outer surface of the substrate 111 may give the LED-filament a sparkling appearance when the LED-filament 110 is powered off (not activated, in its OFF-state). At least the second face 217 may be adapted for reflecting outside light 218, i.e. light from sources other than the LEDs of the LED-filament 110, in various directions.

As illustrated in FIG. 2b, the at least partially light-reflective particles 115 may also redirect light emitted by the LEDs in the ON-state (i.e. when the LED filament is powered on, activated). For example, an at least partially light-reflective particle 115 may reflect light emitted by an LED 112 along a light path 220, or refract the emitted light along another light path 219. This redirection of light may lead to a more omnidirectional spreading of the light emitted by the LED-filament. Spreading the light in more directions and angles may lessen the issue with brightly lit areas and dark shadows with sharp lines there-between, such as caused by conventional LED light sources.

The encapsulation 114 may comprise wavelength converting material. The wavelength converting material may be configured to at least partly convert the light emitted by the LEDs (the LED light) at a first wavelength into (converted) light emitted at a second wavelength different from the first wavelength. The wavelength converting material may give the LED-filament a broader spectrum of light.

As an example, the LEDs 112 of a LED-filament 110 may emit UV light or blue light. The wavelength converting material may be a phosphor such as for example an yttrium aluminium garnet (YAG) based phosphor and/or a lutetium aluminium garnet (LuAG) based phosphor. Wavelength converting material in the encapsulation 114 may be adapted to absorb blue light, and to re-emit the light as radiation 221 with a longer wavelength, such as other blue, green/yellow or red light. For instance, wavelength converting material may be adapted to convert LED light into blue light and/or green/yellow light and/or red light. The combination of LED light and converted light forms the light emitted by the LED filament (LED filament light). The combination of different wavelengths may give the appearance of white light. The resulting white light may for example be within 15 standard deviations of colour matching (SCDM) from the black body line (BBL). Particularly, the resulting white light may be within 10 SCDM from the BBL. More particularly, the resulting white light may be within 7 SCDM from the BBL, such as 5 SCDM from the BBL, or 3 SCDM from the BBL.

The resulting white light may further have a colour rendering index (CRI) of at least 70. Particularly, the resulting white light might have a CRI of at least 75. The resulting white light may have a CRI of at least 80, such as 85 or 90.

Blue light emitted with a small angle relative to the substrate may propagate longer through the substrate than blue light emitted in a more perpendicular direction. Light that propagates longer through the encapsulation may encounter more of the wavelength converting material, which means that a larger portion of this light may be converted to longer wavelengths. This might cause an uneven distribution of the different wavelengths, called colour-over-angle variation (CoA). Redirection of emitted light by light-reflective particles on an outer surface of the encapsulation may lead to more evenly coloured light.

Figure 3:
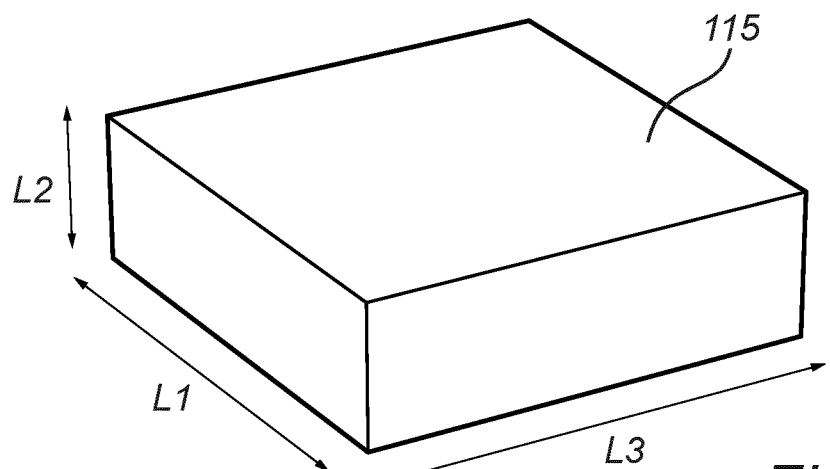
FIG. 3 illustrates an at least partially light-reflective particle in accordance with some embodiments.

With reference to FIG. 3, a particle of the at least partially light-reflective particles (a glitter flake) will be described.

FIG. 3 shows an at least partially light-reflective particle 115 in the shape of a flattened rectangular parallelepiped. This specific shape of the particle 115 is for illustration purposes only. The particles 115 may have shapes of any flattened polyhedrons, or any other flat particle with a high aspect ratio and at least one flat surface. Other examples may for instance include different prisms. In FIG. 3, a longest dimension length L1, a shortest dimension length L2, and a further dimension length L3 are illustrated to characterize the particle 115. The dimension lengths may be related through aspect ratios. A first aspect ratio (AR1) may be the ratio between the longest dimension length L1 and the shortest dimension length L2:

$$AR_1 = \frac{L_1}{L_2}$$

A second aspect ratio (AR2) may be the ratio between the further dimension length L3 and the shortest dimension length L2:

$$AR_2 = \frac{L_3}{L_2}$$

A third aspect ratio (AR3) may be the ratio between the longest dimension length L1 and the further dimension length L3:

$$AR_3 = \frac{L_1}{L_3}$$

To provide a decorative sparkling appearance, the dimension lengths and ratios 115 may meet certain requirements. For instance, the dimension lengths may be in certain intervals or ranges defining appropriate sizes of the particles.

The longest dimension length L1 may be in the range 0.1-3 mm Particularly, the longest dimension length L1 may be in the range 0.15-2 mm. More particularly, the longest dimension length L1 may be in the range 0.2-1 mm, such as for example 0.25 mm or 0.3 mm.

The shortest dimension length L2 may be in the range 10-300 μm. In some embodiments, the shortest dimension length L2 may be in the range 10-200 μm. Particularly, the shortest dimension length L2 may be in the range 10-100 μm, such as for example 12 μm or 20 μm.

The further dimension length L3 may be in the range 0.1-3 mm. Particularly, the further dimension length L3 may be in the range 0.15-2 mm. More particularly, the further dimension length L3 may be in the range 0.2-1 mm, such as for example 0.25 mm or 0.3 mm.

Further, the aspect ratios linking the dimension lengths may also be within specified intervals or ranges, which define suitable shapes for an improved sparkling appearance. For example, the aspect ratios may ensure that the particles have larger reflective surfaces for reflecting external light. The first aspect ratio, AR1, defining the relationship between the longest dimension length and the shortest dimension length, may be in the range 10-300. Particularly, the first aspect ratio may be in the range 15-270. More particularly, AR1 may be in the range 20-250, such as for example 25 or 30.

The second aspect ratio, AR2, defining the relationship between the further dimension length and the shortest dimension length, may be in the range 10-300. Particularly, the second aspect ratio may be in the range 15-270. More particularly, the second aspect ratio may be in the range 20-250, such as for example 25 or 30.

The third aspect ratio, AR3, defining the relationship between the longest dimension length and the further dimension length, may be in the range 0.3-3. In some embodiments, the third aspect ratio may be in the range 0.5-1.5. Particularly, the third aspect ratio may be in the range 0.9-1.1, such as for example 1. In embodiments in which the third aspect ratio, AR3, is 1, the largest surface of the at least partially light-reflective particle 115 may have the shape of a square or a hexagon. Such particles (flakes) can be produced using high precision cutting processes.

According to some embodiments, a surface of an at least partially light-reflective particle 115 may have a surface area of at least 250 μm². Particularly, the surface area may be at least 500 μm². More particularly, the surface area may be at least 1000 μm².

According to some embodiments, a cross-section of the LED filament may have a diameter D. The diameter D may be in the range 1-10 mm. Particularly, the diameter D may be in the range 1.5-7 mm. More particularly, D may be in the range 2-5 mm.

Further, there may be a relation between the diameter D and the size of the particles 115. For example, according to some embodiments, the longest dimension length L1 may be in the range 0.05D-D (i.e. 0.05D<L1<D). Particularly, the longest dimension length L1 may be in the range 0.1D-0.8D (i.e. 0.1D<L1<0.8D). More particularly, L1 may be in the range 0.1D-0.7D (i.e. 0.1D<L1<0.7D).

According to some embodiments, the further dimension length, L3, may also be limited by the length of the diameter D. For example, the further dimension length L3 may be in the range 0.05D-D (i.e. 0.05D<L3<D). Particularly, the further dimension length L3 may be in the range 0.1D-0.8D (i.e. 0.1D<L3<0.8D). More particularly, L3 may be in the range 0.1D-0.7D (i.e. 0.1D<L3<0.7D).

The at least partially light-reflective particles 115 may be rigid. The rigidity of the particles 115 may aid in making the particles flat. Rigidity in combination with the flat surfaces of the particles may make them act as micro-mirrors.

A particle of the at least partially light-reflective particles 115 may have a wavelength reflection coefficient, such that it shows a wavelength dependent reflection behaviour. In some embodiments, the wavelength dependent reflection may be nonlinear. For example, the reflectance may be high in the blue region of visible light, and low in the green/yellow and red regions. This may further improve the colour-over-angle performance of the LED filament. Further, if the reflection of the light-reflective particles varies for different wavelengths of light, the particles may provide coloured sparkling effects.

Further, a particle of the at least partially light-reflective particles 115 may comprise a multi-layer mirror. Alternatively, or additionally, an at least partially light-reflective particle 115 may comprise a dichroic mirror.

Referring back to FIG. 1b, the at least partially light-reflective particles 115 may be randomly distributed and/or randomly oriented on an outer surface of the encapsulation. For example, the particles 115 may be arranged with at least three different orientations, and without a regular pattern.

Alternatively, the particles may be evenly distributed, concentrated towards a certain area of the outer surface of the encapsulation, or arranged in a specific pattern. However, a random distribution and/or orientation may allow the particles 115 to redirect light (both from external sources and emitted by the LEDs 112) in a more arbitrary manner. In the OFF-state, this may contribute to a more pleasant sparkling appearance, and thus a more decorative appearance. In the ON-state, a random distribution and/or orientation may contribute to a more omnidirectional distribution of emitted light and/or of any light converted by wavelength converting material in the encapsulation. A more omnidirectional distribution of light may improve the colour-over-angle (CoA) variation in applications comprising wavelength converting material, in that light of different wavelengths may be more evenly distributed. A more random distribution of the emitted light may also give a softer light, with less sharp contrast, since light may reach new surfaces against which it may be reflected and further spread out. A softer light may provide better depth perception and less glare.

In accordance with some embodiments, the coverage of the at least partially light-reflective particles on the outer surface of the encapsulation may be defined within certain ranges. The coverage of the particles 115 on the outer surface of the encapsulation 114, the LED filament coverage, may be denoted C. $C_{min}$, may be the minimum coverage and $C_{max}$ the maximum coverage. A too small coverage may lead to a loss of the glittering effect, while a too large coverage may block the light emitted by the LEDs. The minimum LED filament coverage may be $C_{min}$=3%. Particularly, the minimum LED filament coverage may be $C_{min}$=5% More particularly, the minimum LED filament coverage may be $C_{min}$=6%, such as for example 7% or 9%.

In some embodiments, the at least partially light-reflective particles 115 may be opaque (i.e. non-transmissive). The particles in such embodiments may provide very good reflective behaviour, but may also block light emitted by the LEDs from escaping the encapsulation 114. In these embodiments, the maximum LED filament coverage may be less than $C_{max}$=40%. Particularly, the maximum LED filament coverage may be less than $C_{max}$=30%. More particularly, the maximum LED filament coverage may be less than $C_{max}$=25%, such as for example 12% or 15%.

In other embodiments, the at least partially light-reflective particles 115 may be transmissive. The transmissivity of the particles may be denoted T. In some embodiments, the transmissivity T is less than 40%. In these embodiments, some light will be allowed to pass through the particles 115, which means that a larger coverage may be achieved without blocking the light emitted by the LEDs. For these embodiments, the LED-filament coverage may be dependent on the transmissivity of the particles 115. However, the maximum coverage should not be smaller than the minimum coverage $C_{min}$=5% For example, the maximum LED filament coverage may be described as:

$$C_{max} = \max_{0 \leq T \leq 50}\left[5, \left(\frac{T}{50}\right) \cdot 100\right]$$

In some embodiments the at least partially light-reflective particles may include both opaque and transmissive particles.

Figure 4:
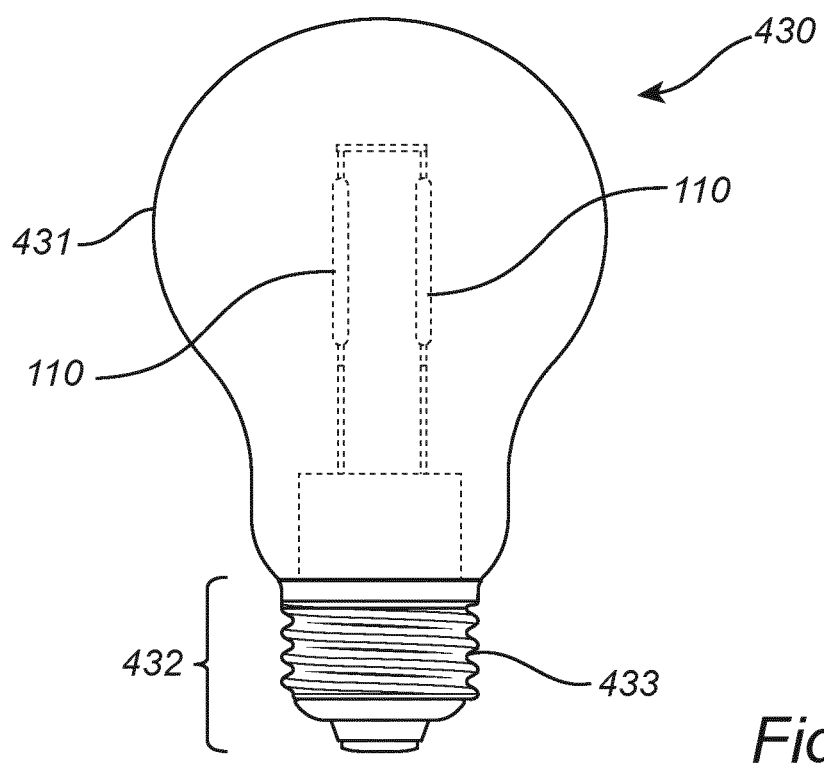
FIG. 4 shows a lighting device in accordance with some embodiments.

With reference to FIG. 4, a lighting device 430 according to some embodiments will be described.

The lighting device 430 may comprise one or more LED filaments 110 in accordance with any of the above described embodiments. The lighting device 430 may further comprise an at least in part light-transmissive envelope 431 which at least partially envelops the one or more LED filaments 110. The envelope 431 may have a pear shape, as illustrated in FIG. 4. It will, however, be appreciated that the envelope 431 may have any shape, such as spherical or tube-shaped. Light emitted from, or reflected by, the at least one LED filament 110 may be output through the envelope 431.

The lighting device 430 may be included in, or constitute a LED bulb or a retrofit lamp. The lighting device 430 may comprise a base 432 on which the envelope 431 may be mounted. The base 432 may further comprise an electrical connector 433 connectable to a socket 541 of a luminaire 540 (shown in FIG. 5). For example, an Edison screw, a bayonet fitting, or any other type of connector known in the art for connecting a lighting device to a lamp or luminaire, may form part of the base.

Figure 5:
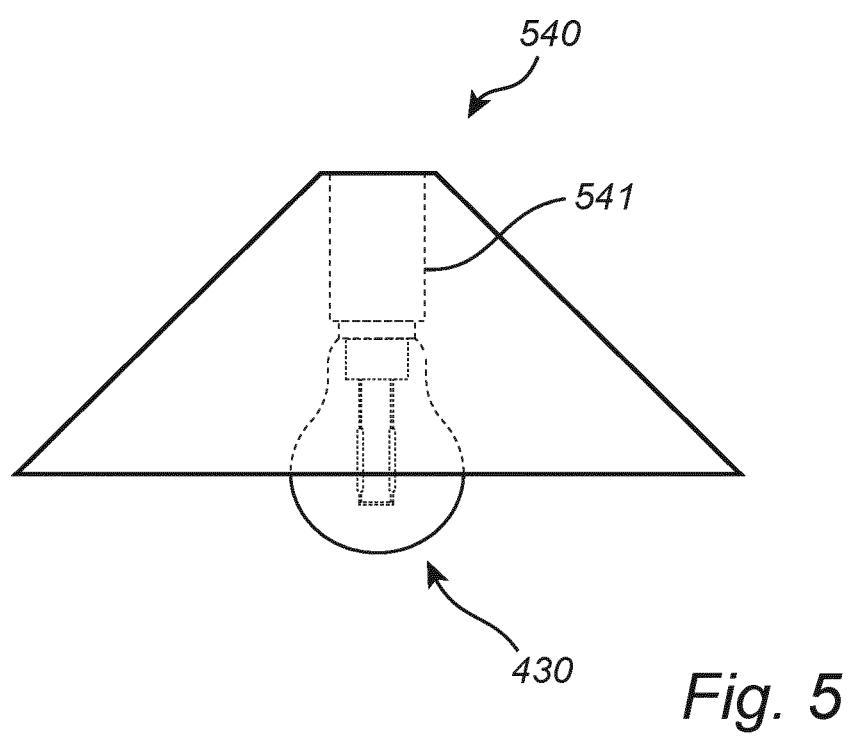
FIG. 5 illustrates a luminaire in accordance with some embodiments.

With reference to FIG. 5, a luminaire 540 in accordance with some embodiments will be described.

The luminaire 540 may comprise a socket 541, connectable with an electrical connector 433 (shown in FIG. 4) of a lighting device 430. Further, the luminaire may comprise a lighting device 430, connected to the luminaire socket 541 by its electrical connector 433.

As a non-limiting example of a LED-filament 110 in accordance with some embodiments, the substrate may for example be made of glass. The length of the substrate 111 may be 50 mm, the width of the substrate 110 may be 3 mm and the thickness of the substrate may be 1 mm.

The plurality of LEDs 115 mechanically attached to the substrate 111 may for example be forty (40) LEDs emitting blue light. The encapsulation 114 may encapsulate both the first and the second major surfaces of the substrate 111, as well as the 40 LEDs. The encapsulation may comprise wavelength converting material such as yellow and red phosphors.

A diameter D, measured over a cross section of the LED filament, may be 3 mm.

The plurality of at least light-reflective particles 115 may be based on polyethylene terephthalate (PET) having an aluminium layer. The particles 115 may have hexagonal shapes. The longest dimension length, L1, may be 250 μm, the further dimension length L3 may be 250 μm, and the shortest dimension length L2 (the thickness) may be 14 μm. The coverage of at least partially light-reflective particles 115 on the encapsulation may be 5%.

The person skilled in the art realizes that the present invention by no means is limited to the preferred embodiments described above. On the contrary, many modifications and variations are possible within the scope of the appended claims.

Although features and elements are described above in particular combinations, each feature or element can be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A light-emitting diode, LED, filament comprising:
an elongated substrate;
a plurality of light-emitting diodes, LEDs, mechanically coupled to the substrate;
an at least in part light-transmissive encapsulation encapsulating the plurality of LEDs and at least partially encapsulating the substrate; and
a plurality of at least partially light-reflective particles arranged on an outer surface of the encapsulation,
wherein a particle of said at least partially light-reflective particles comprises:
a first face lying against the encapsulation, and
a second face opposite to the first face, said second face facing away from the encapsulation,
wherein a particle of the at least partially light-reflective particles has at least one flat surface and is characterised by a longest dimension length (L1), a shortest dimension length (L2), and a further dimension length (L3) and,
wherein a first aspect ratio between the longest dimension length and the shortest dimension length, AR1=L1/L2, is in the range 10-300, wherein a second aspect ratio between the further dimension length and the shortest dimension length, AR2=L3/L2, is in the range 10-300 and wherein a third aspect ratio between the longest dimension length and the further dimension length, AR3=L1/L3, is in the range 0.3-3.

2. The LED filament according to claim 1, wherein the longest dimension length (L1) is in the range 0.1-3 mm, the further dimension length (L3) is in the range 0.1-3 mm, and wherein the shortest dimension length (L2) is in the range 10-300 μm.

3. The LED filament according to claim 1, wherein the LED filament has a diameter D, and wherein the longest dimension length L1 is within the range 0.1D-D.

4. The LED filament according to claim 1, wherein the at least partially light-reflective particles are rigid.

5. The LED filament according to claim 1, wherein the at least partially light-reflective particles are randomly distributed on the encapsulation and/or wherein the at least partially light-reflective particles are randomly oriented.

6. The LED filament according to claim 1, wherein a minimum LED filament coverage, $C_{min}$, representative of the minimum coverage of the at least partially light-reflective particles on the outer surface of the encapsulation, is 3%.

7. The LED filament according to claim 1, wherein a maximum LED filament coverage, $C_{max}$, representative of the maximum coverage of the at least partially light-reflective particles on the outer surface of the encapsulation, is $C_{max}=(T/50)\times 100$ with the at least partially light-reflective particles being transmissive and the transmissivity, T, of an at least partially light-reflective particle being less than 40%, or wherein said maximum LED filament coverage, $C_{max}$, is 30% with the at least partially light-reflective particles being opaque.

8. The LED filament according to claim 1, wherein the at least in part light-transmissive encapsulation comprises wavelength converting material.

9. The LED filament according to claim 1, wherein a particle of the at least partially light-reflective particles has a wavelength dependent reflection coefficient.

10. The LED filament according to claim 1, wherein a particle of the at least partially light-reflective particles comprises a multilayer reflector or a dichroic mirror.

11. A lighting device comprising:
at least one LED filament according to claim 1;
an at least in part light-transmissive envelope, at least partly enveloping said at least one LED filament; and
a base on which said at least in part light-transmissive envelope is mounted, said base comprising an electrical connector for connecting the lighting device to a luminaire socket.

12. A luminaire comprising:
a socket; and
a lighting device according to claim 11, said lighting device being connected to said socket.

* * * * *